United States Patent [19]

Hood et al.

[11] Patent Number: 4,721,636

[45] Date of Patent: Jan. 26, 1988

[54] MULTIPLE PANE GLASS UNIT WITH ELECTRICALLY CONDUCTIVE TRANSPARENT FILM FOR USE AS RADIATION SHIELD

[75] Inventors: Thomas G. Hood, San Francisco; Steve M. Vincent, Palo Alto; Dennis Hollars, Mountain View, all of Calif.

[73] Assignee: Southwall Technologies, Inc., Palo Alto, Calif.

[21] Appl. No.: 806,733

[22] Filed: Dec. 9, 1985

Related U.S. Application Data

[63] Continuation-in-part of Ser. No. 667,234, Nov. 1, 1984.

[51] Int. Cl.$^4$ .......................... E06B 3/24; B44C 5/08; E04C 2/54; H05B 3/06
[52] U.S. Cl. ........................................ 428/38; 428/34; 428/921; 428/922; 219/522; 219/543; 52/171; 52/788; 52/789; 52/790
[58] Field of Search .................... 428/34, 38, 921, 922; 219/522, 543; 52/171, 788, 789, 790

[56] References Cited

U.S. PATENT DOCUMENTS

| | | | |
|---|---|---|---|
| 2,552,955 | 2/1951 | Gaiser et al. | 219/544 |
| 3,911,245 | 10/1975 | O'Shaughanessy | 219/218 |
| 4,247,737 | 1/1981 | Johnson et al. | 174/35 MS |
| 4,335,166 | 6/1982 | Lizardo et al. | 428/34 |
| 4,613,530 | 9/1986 | Hood et al. | 428/34 |

FOREIGN PATENT DOCUMENTS

| | | | |
|---|---|---|---|
| 372749 | 11/1983 | Austria | 428/38 |
| 1509602 | 2/1962 | Fed. Rep. of Germany | 428/38 |
| 1981338 | 3/1968 | Fed. Rep. of Germany | 428/34 |
| 2436472 | 11/1980 | France | 428/38 |
| 01149 | 3/1983 | PCT Int'l Appl. | 428/38 |
| 2064629 | 6/1981 | United Kingdom | 428/38 |

Primary Examiner—John E. Kittle
Assistant Examiner—Patrick J. Ryan
Attorney, Agent, or Firm—Townsend and Townsend

[57] ABSTRACT

A glass unit suitable for use as a window in a building comprising at least a pair of spaced, generally parallel, electrically conductive and transparent films in a space between a pair of glass panes. The films are taut and a conductive lead is electrically connected with the films to couple them to ground.

14 Claims, 3 Drawing Figures

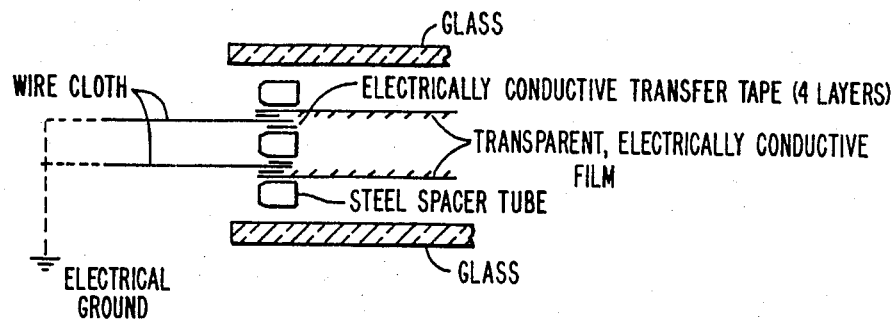
FIG._1.
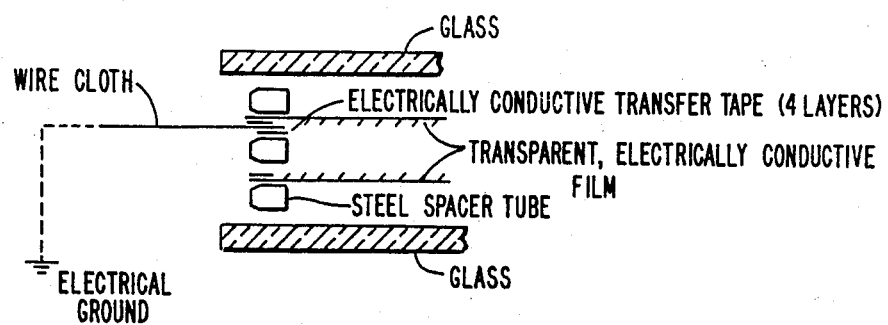
FIG._2.
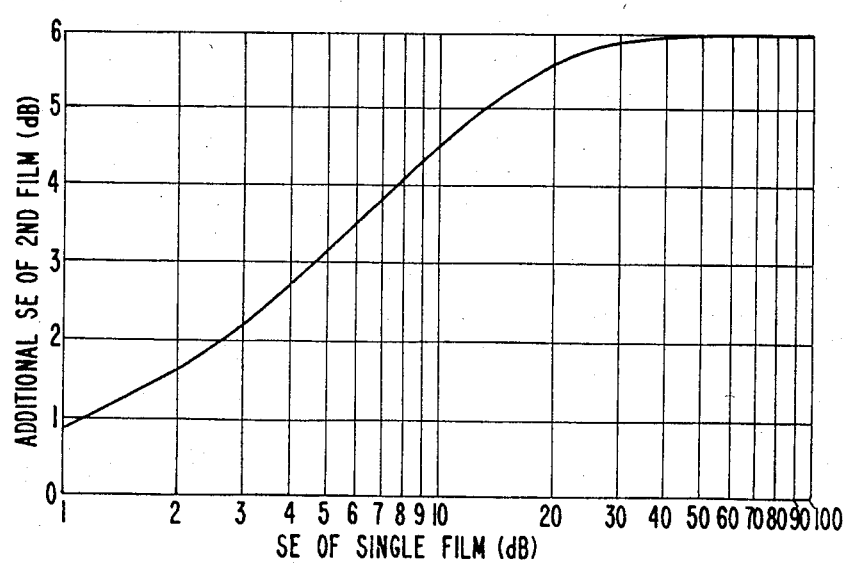
FIG._3.

MULTIPLE PANE GLASS UNIT WITH ELECTRICALLY CONDUCTIVE TRANSPARENT FILM FOR USE AS RADIATION SHIELD

Continuation in part for U.S. patent application—Multiple Pane Glass Unit With Electrically Conductive Transparent Film For Use As A Radiation Shield Ser. No. 667,234, filed 11/1/84.

BACKGROUND

The above patent addressed the need for architectural windows to allow for good light transmission while shielding against radio frequency (RF) energy. The significance of RF shielding for architectural windows is directly associated with the dramatic growth and widespread use of radio frequency emitting devices. Radio stations, microwave relay stations, televisions, computers, two-way radios, and many other electronic devices either use or transmit electromagnetic energy in the radio frequency range—from 100 Hz to 100 GHz.

The need for shielding in buildings has several bases. One such basis is the protection of electronic equipment from interfering with the operation of other electronic equipment. An example would be in the operation of high energy RF emitting equipment (e.g. a ship's radar) which might penetrate a nearby building's outer shell and cause electronic error to occur in a digital computer system.

A second basis for shielding might involve the protection of people from RF energy, which in high doses causes tissues to heat, e.g. in the use of microwave ovens. In lower doses, other biological damage is possible.

A third need for shielding arises with concern for electronic spying—for political, economic or industrial advantage. This concern is justly based on the relative ease by which one can remotely (up to 2 mile away in some circumstances) monitor the information on a standard computer Cathode Ray Tube (CRT) screen.

CONTINUATION IN PART

This continuation in part attempts to show a unique solution to the shielding of windows in buildings which require such protection. The original patent application expounded a concept which involved the use of a single transparent and electrically conductive film which was integrally mounted in a sealed insulating glass unit. Furthermore, a single, continuous wire cloth was used around the periphery, in direct contact with the electrically conductive film. This was accomplished by penetrating the seal of the glass unit without disrupting the hermetic quality of the unit.

The modifications and additions shown here involve essentially the same materials, however they are used in a way which offers shielding performance beyond that which would have otherwise been predicted. The use of multiple electrically conductive and transparent coatings (or films), which are produced by vacuum processes, (e.g. sputtering), creates a shield whose effectiveness exceeds the predicted results. These films are assembled in the insulating glass unit so that they are effectively parallel to one another (see FIG. 1).

IN THE DRAWINGS

FIG. 1 shows a multiple film and wire cloth construction;

FIG. 2 shows another version of the construction of FIG. 1;

FIG. 3 is a graphic view showing shield effectiveness for a film;

FIG. 4 shows cavity width of the construction; and

FIG. 5 is a graphic view showing the effect of cavity width on shielding.

FIG. 1 illustrates the use of two conductive, transparent films in conjunction with two conductive, wire cloths. This configuration can also be utilized with a single wire cloth for grounding purposes, however, at a slight performance loss. (see FIG. 2)

The performance of the single film/single cloth construction of the earlier patent application, showed experimentally to have a relatively flat shielding performance between 100 MHz and 10 GHz, ranging from 30–36 dB. This shielding performance can be predicted for this far field energy by the equation:

$$SE_{db} = 20 \log_{10}(188.5/R) \quad (1)$$

$SE_{db}$ = Shielding Effectiveness in decibels
R = surface resistivity in ohms per square Therefore, with a film that has R=4 ohms per square, the predicted shielding effectiveness, $SE_{db}$, is equal to 33.5 db. This was verified through experimental measurement.

A means of predicting the shielding performance for multiple, parallel films is to consider an effective sheet resistivity based on a parallel resistor network:

$$(1/R_{eff}) = (1/R_1) + (1/R_2) \ldots + (1/R_n) \quad (2)$$

Where
$R_{eff}$ = the effective sheet resistivity for n parallel films, ohms per square
n = number of parallel films Substituting into equation (1) results in:

$$SE_{db} = 20 \log_{10}(188.5/R_{eff}) \quad (3)$$

For two films of identical sheet resistivity, equation (3) reduces to:

$$SE_{db} = 20 \log_{10}(188.5/R) + 6.02 \quad (4)$$

Using R=4 ohms per square for both films, results in:

$$SE_{db} = 33.5 + 6.02 = 39.52 \, db \quad (5)$$

The conclusion is, therefore, that the addition of an identical, and parallel film will result in a theoretical maximum increase of 6 dB in the shielding effectiveness. FIG. 3 illustrates that the additional benefit of two films, vs one film, approaches 6 dB as a maximum achievable benefit.

Actual test results on two film units found performance levels higher than the predicted value of 39 dB. Test samples made with a single ground cloth as illustrated in FIG. 2, were found to have:

$$SE_{db} = 45 - 50 \, db \text{ (from 200 MHz} - 1 \text{ GHz)}$$

Test samples which utilized two films and two screens, FIG. 1, were measured to have:

$$SE_{db} = 55 - 60 \, db \text{ (from 200 MHz} - 1 \text{ GHz)}$$

These results show actual shielding performance to exceed predicted performance by 6 to 21 dB.

These unexpected benefits, it is believed, can be explained by a more complicated model, whereby a "cavity effect" yields a greater than expected shielding performance. Through the numerical solution of Maxwell's equations for plane waves, it is possible to predict not only these measured improvements, but to graphically illustrated the dependency on cavity dimension. This new approach for modeling is based on optics (in the RF region of the electromagnetic spectrum) using multi-layer thin films, as opposed to the more convential analysis incorporating circuit modeling techniques. The optical model also allows for accurate prediction of single film shielding performance.

Through the use of this new modeling technique, it is possible to show the effects of cavity design on the performance of the shielding window. The main design criteria involves the distance separating the two conductive films; that is the width of the cavity. This is illustrated in FIG. 4.

By computing the shielding effectiveness as a function of frequency for various cavity widths, it is possible to see the dependency that performance has on this parameter. This is shown for two conductive films (R+2.2 ohms per square).

Given that the application of interest is for a sealed architectural window, the physical restrictions would limit the cavity widths to less than 4 cm. However, with specific design modifications, larger cavities can be made possible. It is predicted that at larger cavity widths, a resonance may occur which would significantly reduce the shielding at a particular frequency in the RF spectrum. If such a reduction in shielding occurred at an unwanted frequency, then the cavity width would have to be reduced.

It is clear from FIG. 5 that at all frequencies between 10 MHz and 10 GHz, the "cavity design" allows for equal or greater than expected results from previously held theories. These predictions have been experimentally verified. A shielding sample consisting of two films of 1.9 ohms per square were assembled as illustrated in FIG. 1. This sample window measured 58"×102" and was tested from 10 MHz to 1 GHz. The cavity width was 0.5 inch. Standard, theory would predict from equation (1) and FIG. 3 a shielding performance of 46 dB. Measured performance found an average attenuation greater than 50 dB, as well as a trend of improved performance with increasing frequency, as suggested in FIG. 5.

SUMMARY

The initial product submitted for patent application consisted of a single transparent, electrically conductive film, used in conjunction with a single wire cloth ground. This submittal represents the addition of one or more transparent, electrically conductive films and one or more wire cloth grounds. The performance of this multiple film/wire cloth product outperforms the expected (as predicted by conventional theory) shielding. A more extensive RF optical model does predict both the higher performance and the improved shielding at higher frequencies in the RF spectrum.

We claim:
1. A glass unit comprising:
   a pair of glass panes,
   a pair of transparent, electrically conductive films having outer peripheral margins;
   means coupled with said films for mounting the films in spaced relationship adjacent to and spaced from respective panes; and
   means coupled with the films for electrically connecting the films to ground.
2. A glass unit as set forth in claim 1, wherein the films are in respective, parallel planes.
3. A glass unit as set forth in claim 2, wherein the films are taut and are parallel with the glass pane.
4. A glass unit as set forth in claim 1, wherein is included spacer means for coupling the outer peripheral margins of the films with the outer peripheral margins of the glass pane.
5. A glass unit comprising:
   a pair of spaced glass panes;
   a pair of spaced transparent, electrically conductive films;
   spacer means coupled with said films for mounting the films in the space between the glass panes in a taut condition; and
   means coupled with the films for electrically connecting the films to ground.
6. A glass unit as set forth in claim 5, wherein the spacer means includes a number of tubular, metallic spacers.
7. A glass unit as set forth in claim 5, wherein the spacer means includes a number of spacers, each spacer having a pair of opposed, flat sides, one of said sides of each spacer being adjacent to the outer peripheral margin of a respective film.
8. A glass unit as set forth in claim 7, wherein said spacers include a pair of side spacers and a central spacer between the side spacers, the outer peripheral margin of each film being between a respective side spacer and the central spacer.
9. A glass unit as set forth in claim 8, wherein is indicated an electrically conductive tape between each film and the central spacer.
10. A glass unit as set forth in claim 8, wherein said connecting means includes a single electrical conductor between one of the films and the central spacer, there being means electrically coupling the other film and the electrical conductor.
11. A glass unit as set forth in claim 10, wherein said central spacer is electrically conductive.
12. A glass unit as set forth in claim 10, wherein said electrical conductor comprises a wire cloth segment.
13. A glass unit as set forth in claim 8, wherein said connecting means includes a pair of spaced electrical conductors, each conductor having an end portion between a respective film and the central spacer.
14. A glass unit as set forth in claim 13, wherein each electrical conductor includes a wire cloth segment.

* * * * *